US006707140B1

(12) United States Patent
Nguyen et al.

(10) Patent No.: US 6,707,140 B1
(45) Date of Patent: Mar. 16, 2004

(54) ARRAYABLE, SCALEABLE, AND STACKABLE MOLDED PACKAGE CONFIGURATION

(75) Inventors: Luu Nguyen, Sunnyvale, CA (US); Cade Murray, Fremont, CA (US); Peter Deane, Los Altos, CA (US); Chen-Hui Tsay, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/568,558

(22) Filed: May 9, 2000

(51) Int. Cl.⁷ .............................. H01L 23/02
(52) U.S. Cl. .............. 257/686; 257/777; 257/778
(58) Field of Search ................... 257/686, 777, 257/778, 723, 675, 678

(56) References Cited

U.S. PATENT DOCUMENTS

| | | | |
|---|---|---|---|
| 5,019,673 A | | 5/1991 | Juskey et al. |
| 5,139,969 A | * | 8/1992 | Mori ............... 437/183 |
| 5,352,926 A | | 10/1994 | Andrews |
| 5,579,208 A | | 11/1996 | Honda et al. |
| 5,608,262 A | | 3/1997 | Degani et al. |
| 5,723,369 A | | 3/1998 | Barber |
| 5,726,079 A | | 3/1998 | Johnson |
| 5,744,827 A | * | 4/1998 | Jeong et al. ........ 257/686 |
| 5,790,384 A | | 8/1998 | Ahmad et al. |
| 5,798,567 A | | 8/1998 | Kelly et al. |
| 5,821,615 A | * | 10/1998 | Lee ............... 257/686 |
| 5,949,135 A | * | 9/1999 | Washida et al. ..... 257/685 |
| 6,043,430 A | * | 3/2000 | Chun ............... 257/672 |
| 6,054,759 A | * | 4/2000 | Nakamura ......... 257/691 |
| 6,075,284 A | * | 6/2000 | Choi et al. ........ 257/676 |
| 6,236,109 B1 | * | 5/2001 | Hsuan et al. ....... 257/688 |
| 6,258,630 B1 | * | 7/2001 | Kawahara ......... 438/122 |
| 6,316,837 B1 | * | 11/2001 | Song ............... 257/778 |
| 6,316,838 B1 | * | 11/2001 | Ozawa et al. ...... 257/778 |
| 2001/0013645 A1 | * | 8/2001 | King et al. ........ 257/678 |

FOREIGN PATENT DOCUMENTS

JP          60-202956          10/1985
JP          08-125066      *   5/1996

OTHER PUBLICATIONS

S. Savastiouk, PH.D., et al. "3–D stacked wafer–level packaging", Mar. 2000, *Advanced Packaging*, pp. 28–34.
National Semiconductor, "Packaging Databook", *1993 National Semiconductor*, pp. v–xi to 1–3 to 1–4, 3–1 to 3–20, 3–30 to 3–31, 3–62 to 3–69. *Please note: The year of publication is sufficiently earlier than the effective U.S. filing date so that the particular month of publication is not in issue.*

* cited by examiner

*Primary Examiner*—Phat X. Cao
(74) *Attorney, Agent, or Firm*—Beyer Weaver & Thomas, LLP

(57) ABSTRACT

A stacked molded package comprising a semiconductor package attached to an electronic device. The semiconductor package includes a semiconductor die which is connected to a set of wire leads and is encapsulated within a protective molding material. Additionally, solder bumps within the molding material are attached to input and output contact points on the semiconductor die. Portions of the solder bumps are exposed through the surface of the molding material so that contact can be made with the electrical contacts of an electronic device to be stacked upon the semiconductor package. The electronic device may be, for example, another semiconductor die or an opto-electronic transceiver. The present invention also includes a method for manufacturing the stacked molded package. The method involves forming the semiconductor package within a molding chamber which is injected with the protective molding material. The method further involves lowering the top surface of the molding chamber onto the solder bumps of the semiconductor package. The contact between the top surface of the molding chamber and the solder bumps flattens a portion of the solder bumps and prevents the flattened portion from being covered with molding material. Manufacturing the semiconductor package may be performed with the current manufacturing infrastructure which is used to make semiconductor packages according to specific form factors. A stacked package is formed when an electronic device is attached to the molded package.

28 Claims, 8 Drawing Sheets

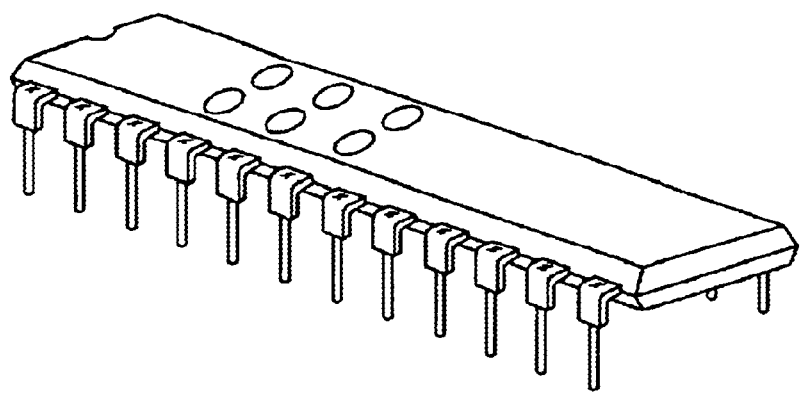
FIG. 13
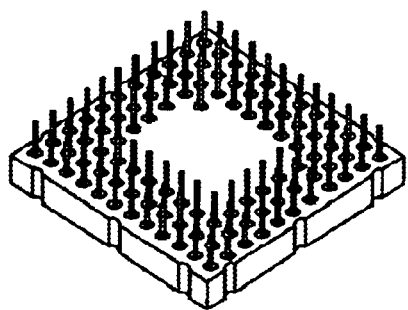
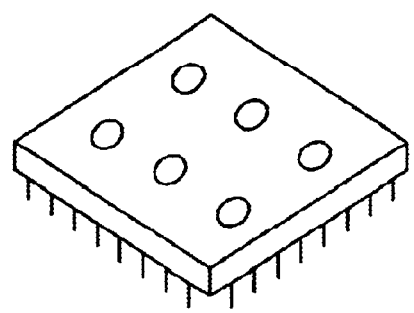
FIG. 14A    FIG. 14B

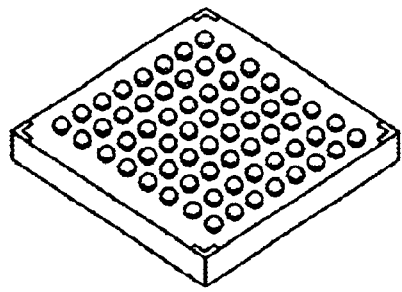
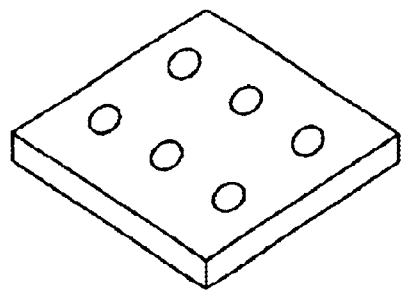
FIG. 15A                    FIG. 15B
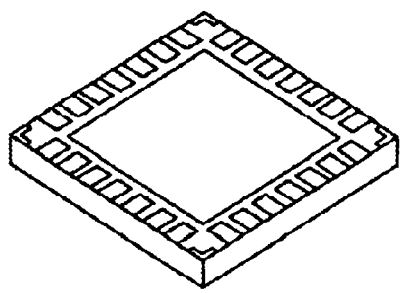
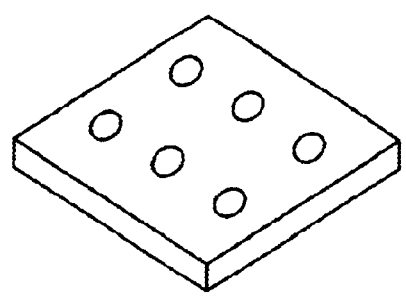
FIG. 16A                    FIG. 16B

ARRAYABLE, SCALEABLE, AND STACKABLE MOLDED PACKAGE CONFIGURATION

FIELD OF THE INVENTION

The present invention relates generally to integrated circuit packages, and more specifically, to stackable chip-on-chip integrated circuit packages.

BACKGROUND

Computing systems require an increasing amount of functionality. Generally, functionality is added by increasing the number of integrated circuits on a microprocessor chip. On occasion, however, it is not possible or desirable to integrate all the needed functionality onto one chip. An alternative method of obtaining an increased amount of functionality is achieved by including more than one chip in a single semiconductor package. For example, semiconductor manufacturers have placed two or more chips side-by-side or on top of each other in a single package. Since each chip is often made by distinct manufacturing processes and different materials, and is optimized for distinct performance characteristics, such a package provides a range of functionality not possible when using a single chip.

The performance of a package with stacked chips is often significantly greater when compared to a package having chips which are coupled together in a side-by-side configuration. Stacked-chip configurations operate faster since the chips are brought physically close to each other, thereby allowing input and output signals to travel between each chip in less time. Additionally, stacked-chip configurations typically occupy a relatively small footprint. That is, stacked chips require less surface area on a circuit board than two chips which are coupled together in a side-by-side configuration. These performance improvements make the stacked-chip configuration very desirable.

Unfortunately, however, stacked chips present a problem in the semiconductor package assembly process since most of the existing semiconductor manufacturing infrastructure is customized for single chip configurations. It is very difficult to use single-chip manufacturing infrastructure to assemble packaged, stacked-chip devices. One known technique attempting to use the existing infrastructure to assemble stacked-chip devices reduces the thickness of each chip (i.e., by chemical etching) so that multiple chips may fit into infrastructure designed for single chips. The problem with this method is that the thinning process is time consuming and may damage the chips.

Ideally, stacked chip devices may be manufactured using specially tailored infrastructure. However, it would be very costly to acquire new infrastructure for such a purpose. Since the characteristics of stacked-chip configurations are very beneficial, an effective and cost-efficient method for manufacturing stacked-chip devices would be desirable.

SUMMARY

The present invention provides a semiconductor package containing stacked devices which can be manufactured in an effective and cost-efficient manner. The stacked molded package of the present invention includes a semiconductor package attached to an electronic device. The semiconductor package includes a semiconductor die which is connected to a set of wire leads and is encapsulated within a protective molding material. Additionally, solder bumps within the molding material are attached to input and output contact points on the semiconductor die. Portions of the solder bumps are exposed through the surface of the molding material so that contact can be made with the electrical contacts of an electronic device stacked on the semiconductor package. The number and pattern of the semiconductor package's solder bumps can be tailored to match the configuration of electrical contacts on the electronic device. The electronic device may be, for example, another semiconductor die or an opto-electronic transceiver. Also, heat slugs and heat sinks may be included within the semiconductor package and attached to the stacked electronic device.

The present invention also includes a method for manufacturing the stacked molded package. The method involves forming the semiconductor package within a molding chamber which is injected with the protective molding material. The method further involves lowering the top surface of the molding chamber onto the solder bumps of the semiconductor package. The contact between the top surface of the molding chamber and the solder bumps flattens a portion of the solder bumps and prevents the flattened portion from being covered with molding material. This flattened portion becomes the portion of the solder bumps which are exposed through the molding material. Manufacturing the semiconductor package may be performed with the current manufacturing infrastructure which is used to make semiconductor packages according to specific form factors. Such form factors may include SOP, QFP, DIP, BGA, etc. The ability to use current infrastructure provides great cost savings because specially tailored infrastructure for manufacturing stacked molded packages does not need to be acquired. Also, since only a single chip is packaged within the semiconductor package, the thinning of chips and the accompanying problems may be avoided. A stacked package is formed when an electronic device is attached to the molded package.

These and other features and advantages of the present invention will be presented in more detail in the following specification of the invention and the accompanying figures which illusive by way of example the principles of the invention.

BRIEF DESCRIPTION OF THE DRAWINGS

The invention, together with further advantages thereof, may best be understood by reference to the following description taken in conjunction with the accompanying drawings in which:

FIG. 13 illustrates a perspective view of a DIP (Dual In-Line Package).

FIG. 14A illustrates a perspective view of the bottom surface of a mother package which is PGA (Pin Grid Array).

FIG. 14B illustrates a perspective view of the top surface of the mother package of FIG. 14A.

FIG. 15A illustrates a perspective view of the bottom surface of a mother package which is a BGA (Ball Grid Array).

FIG. 15B illustrates a perspective view of the top surface of the mother package of FIG. 15A.

FIG. 16A illustrates a perspective view of the bottom surface of a mother package which is a CSP (Chip Sized Package).

FIG. 16B illustrates a perspective view of the top surface of the mother package of FIG. 16A.

DETAILED DESCRIPTION ON OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The stacked molded package of the present invention includes a semiconductor package attached to an electronic device. The semiconductor package includes a semiconductor die which is connected to a set of wire leads and is encapsulated within a protective molding material. Additionally, solder bumps within the molding material are attached to input and output contact points on the semiconductor die. Portions of the solder bumps are exposed through the surface of the molding material so that contact can be made with the electrical contacts of an electronic device stacked on the semiconductor package. The electronic device may be, for example, another semiconductor die or an opto-electronic transceiver. The present invention includes several aspects which facilitate heat dissipation. First, thermal solder bumps and underfill material may be added between the semiconductor package and the stacked electronic device. Also, heat slugs and heat sinks may be included within the semiconductor package and attached to the stacked electronic device.

The present invention also includes a method for manufacturing the stacked molded package. The method involves forming the semiconductor package within a molding chamber which is injected with the protective molding material. The method further involves lowering the top surface of the molding chamber onto the solder bumps of the semiconductor package. The contact between the top surface of the molding chamber and the solder bumps flattens a portion of the solder bumps and prevents the flattened portion from being covered with molding material. This flattened portion becomes the portion of the solder bumps which are exposed through the molding material. A stacked package is formed when an electronic device is attached to the molded package.

Figure 1:
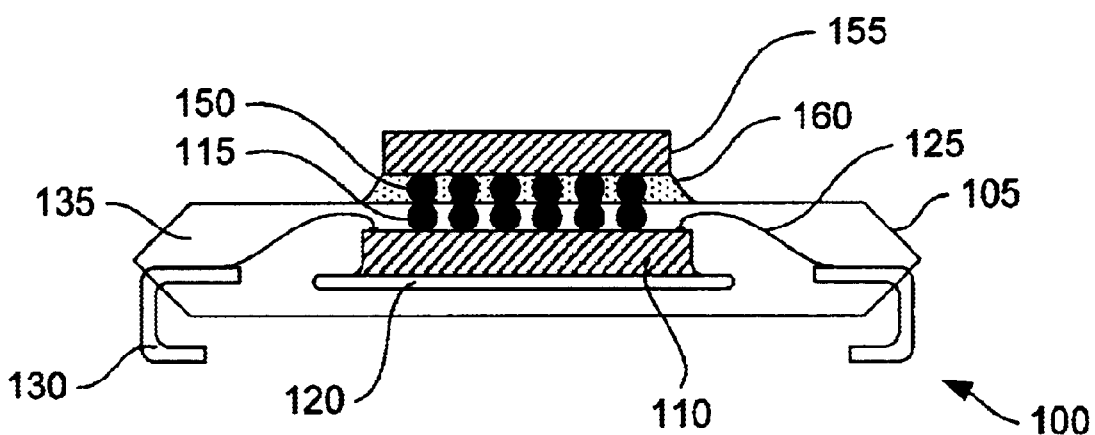
FIG. 1 illustrates a side cross-sectional view of one embodiment of a stacked molded package.

FIG. 1 illustrates a side cross-sectional view of one embodiment of the stacked molded package 100 of the present invention. The stacked molded package 100 includes a mother package 105 connected to a daughter die 155. The mother package 105 is a semiconductor package containing a "mother" integrated circuit die 110. Generally, the mother die 110 is attached to a die attach pad 120 and is electrically connected to wire leads 130 by interconnecting wires 125. The wire leads 130 allow the mother die 110 to be electrically connected and secured to a printed circuit board or some other electronic component. The interconnecting wires 125 are formed through the well-known methods of wire bonding. Molding material 135, a plastic, epoxy, or other suitable material, encapsulates the mother die 110, the interconnecting wires 125, and part of the wire leads 130. The molding material 135 provides the mother package 105 with a structural form which may be more easily handled and protects the mother die 110. In some embodiments, the mother package 105 will be manufactured according to specific form factors. Form factors represent standard configurations and dimensions for the die, die attach pad, wire leads, molding material, etc. of semiconductor packages. Some exemplary form factors offered in the portfolio of the National Semiconductor Corporation (NSC) include SOP (Small Outline Package), DIP (Dual In-Line Package), PGA (Pin Grid Array), LCC (Leaded Chip Carrier), QFP (Quad Flatpack), BGA (Ball Grid Array), and CSP (Chip Sized Package). It should be noted that form factors not provided by NSC may also be suitable for this invention.

Multiple solder bumps 115 are attached to the input and output contacts on the top surface of the mother die 110. The solder bumps 115 are partially exposed through the surface of the molding material 135. The solder bumps 115 may be arranged in regularly spaced rows and columns, along the perimeter of the mother die 110, or in any arrangement matching the electrical contact pattern of the daughter die 155. As can be appreciated by those of ordinary skill in the art, the size and shape of the molding material 135, the die attach pad 120, and the wire leads 130 will vary according to the specific form factor used to manufacture the mother package 105.

Solder bumps 150 are attached to the input and output contacts on the surface of the daughter die 155. Each of the solder bumps 150 are aligned with respective solder bumps 115 of the mother package 105. The connection between the solder bumps 150 and the solder bumps 115 bonds the daughter die 155 to the mother package 105. The connection also serves as paths for data to travel between the I,O's of the mother die 110 and the daughter die 155. In alternative embodiments of the invention, the mother package 105 may be connected to various electronic devices, such as an opto-electronic transceiver.

Underfill material 160 fills the spaces formed between the solder bumps 150 of the daughter die 155. The underfill material 160 may serve as an additional bonding agent which bonds the daughter die 155 to the mother package 105. The underfill material may also increase the flow of heat between the mother die 110 and the daughter die 155.

An increase in heat flow increases the heat dissipation capabilities of the stacked molded package 100. Additionally, the underfill material 160 may relieve the heat-cycle stress experienced by the solder bumps 150. Heat-cycle stress is the stress caused by repeated cycles of expansion and contraction induced by the temperature fluctuations in the molded packaged 100. Heat-cycle stress tends to weaken the solder bumps 150 and thereby the connection between the mother package 105 and the daughter die 155. As may be appreciated, the stacked molded package 100 may be manufactured without underfill material 160. In an alternative embodiment, extra "thermal" solder balls may be formed between the molding material 135 and the daughter die 155 to provide relief from heat-cycle stress and to increase the number of paths available for heat dissipation. As may be appreciated by those of ordinary skill in the art, thermal solder balls need not connect any I/O's between the stacked die.

Figure 2:
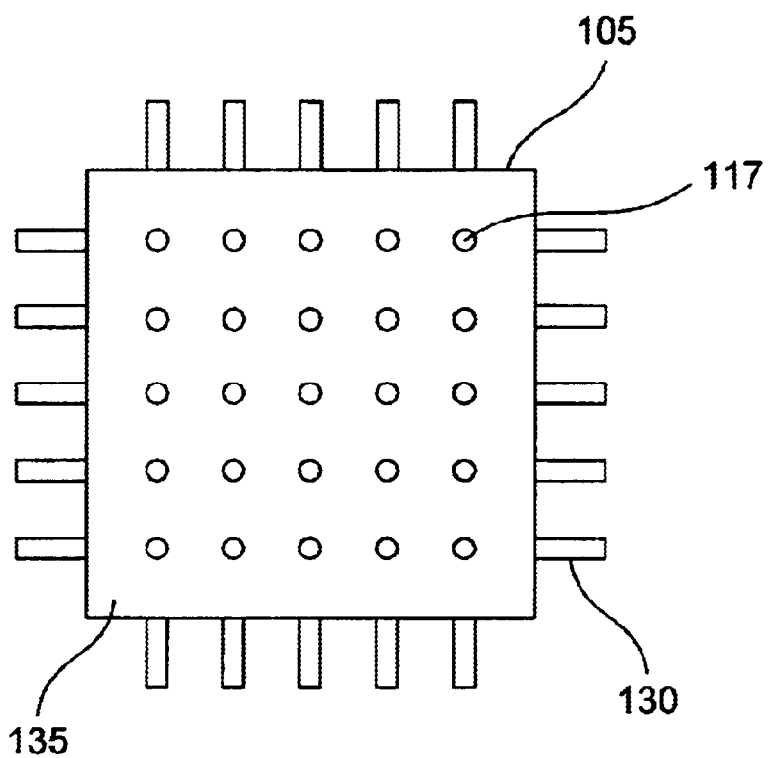
FIG. 2 illustrates the top plan view of the mother package in FIG. 1.

FIG. 2 illustrates the top plan view of the mother package 105 in FIG. 1. Pads 117 represent the portion of the solder bumps 115 which are exposed through the top surface of the molding material 135. Each pad 117 represents an area upon which each respective solder bump 150 of the daughter die 155 would be connected. In this embodiment, the pads 117, and therefore the solder bumps 115, are formed in an array of regularly spaced rows and columns. The wire leads 130 extend from each edge of the molding material 135. In one embodiment of the invention, the spacing between each pad, referred to as the "pitch," is approximately 500 microns. Generally, the solder balls 115 and the pads 117 are positioned in a pattern ("footprint") which matches the footprint of the daughter die or the specific electronic device to be attached to the package 105. The total number of solder bumps 115 varies depending upon the degree of functionality provided by the attached device. For example, only four I/O's may be required when a specific type of opto-electronic transceiver is attached to the mother package 105. With other stacked device combinations, the number of solder bumps 115 required may be much higher.

Figure 3:
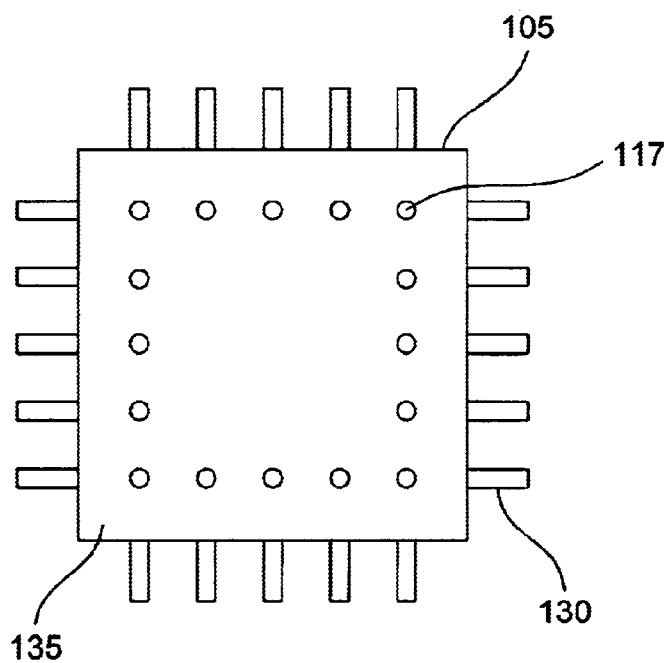
FIG. 3 illustrates an alternative embodiment of the package in FIG. 2 which has pads arranged in a peripheral pattern.
Figure 4:
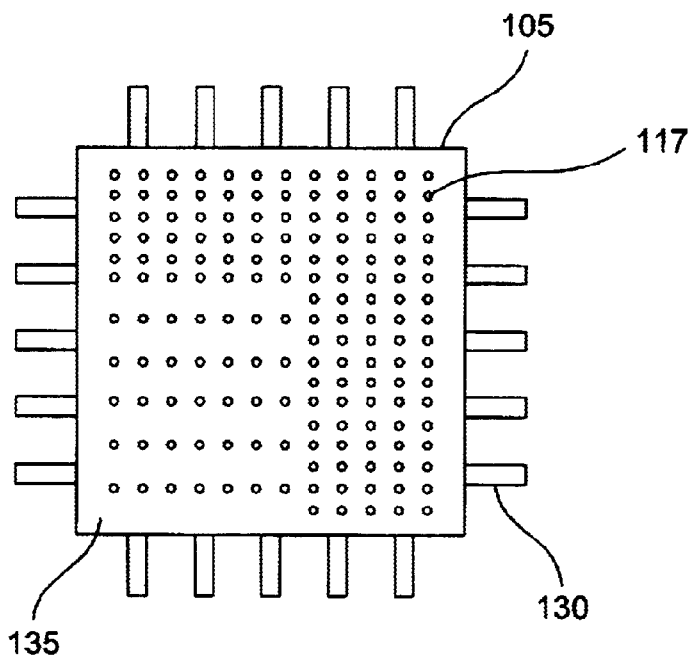
FIG. 4 illustrates another alternative embodiment of the package in FIG. 2 which has pads arranged in a mixed pattern.

FIG. 3 illustrates an alternative embodiment of the package 105 in which the pads 117 are arranged in a peripheral pattern. The pads 117 in the peripheral pattern are located about the perimeter of the package 105. A semiconductor die or an electronic device with a matching footprint may be stacked on top of the package 105. FIG. 4 illustrates another alternative embodiment of the package 105 where the pads are arranged in a mixed pattern. In a mixed pattern, the pads 117 are interspersed without fully populating the surface of the package 105. As can be seen in FIG. 3 and 4, the wire leads 130 extend from each edge of the molding material 135.

Figure 5:
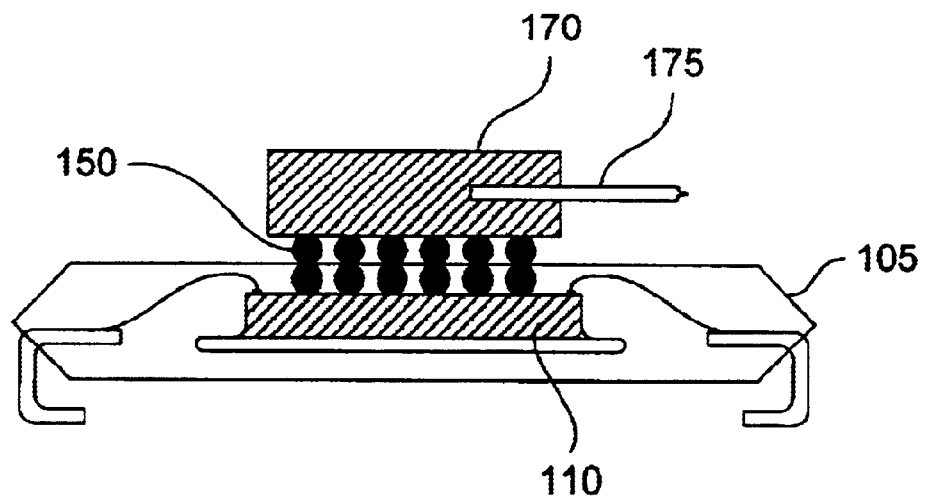
FIG. 5 illustrates an embodiment of the invention wherein an opto-electronic transceiver is stacked on top of a packaged die.

FIG. 5 illustrates an embodiment of the invention where an opto-electronic transceiver 170 is stacked on top of the mother package 105. An optic fiber 175, extending from the opto-electronic transceiver 170, carries data to and from the stacked package 100. The pads 117 of the package 105 are formed in a footprint which matches the footprint of solder balls 150 on the opto-electronic transceiver. The matching footprints allow data to be transferred between the IO's of the mother die 110 and the transceiver 170.

Figure 6:
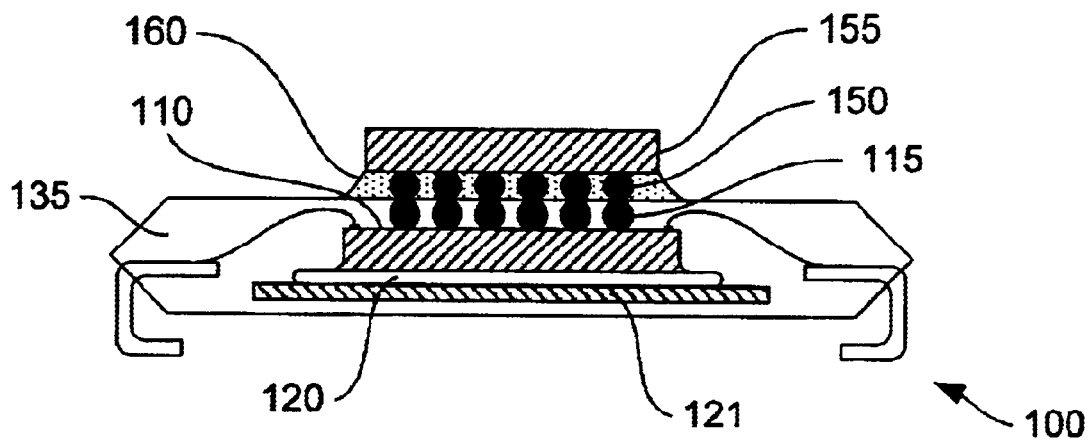
FIG. 6 illustrates an embodiment of the stacked molded package having a heat slug attached to the bottom surface of the die attach pad.

FIG. 6 illustrates an embodiment of the stacked molded package 100 having a heat slug 121 attached to the bottom surface of the die attach pad 120. The heat slug 121 is fully encapsulated within the molding material 135. The heat slug 121 provides an area for heat generated from both the daughter die 155 and the mother die 110 to collect in order to prevent the stacked die combination from overheating.

The heat generated from the daughter die 155 travels towards the heat slug through the solder bumps 150 and 115, underfill material 160, and the molding material 135. As can be appreciated by those of ordinary skill in the art, the heat slug 121 can be a variety of shapes and sizes depending upon the amount of heat dissipation required.

Figure 7:
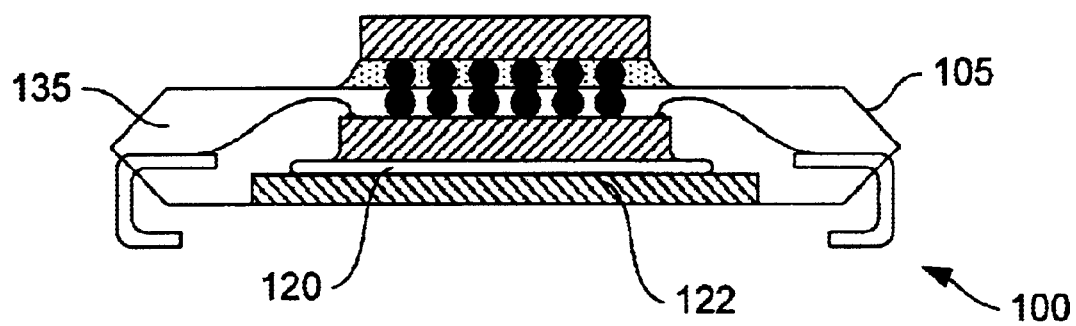
FIG. 7 illustrates the configuration shown in FIG. 6 wherein a surface of the heat slug is exposed through the surface of the molding material.

FIG. 7 illustrates another embodiment of the stacked molded package 100 having a heat slug 122 attached to the bottom surface of the die attach pad 120. In contrast to FIG. 6, the bottom surface of the heat slug 122 is exposed through the bottom surface of the molding material 135. This heat slug 122 configuration allows the heat in the heat slug to dissipate to the outside of the mother package 105.

Figure 8:
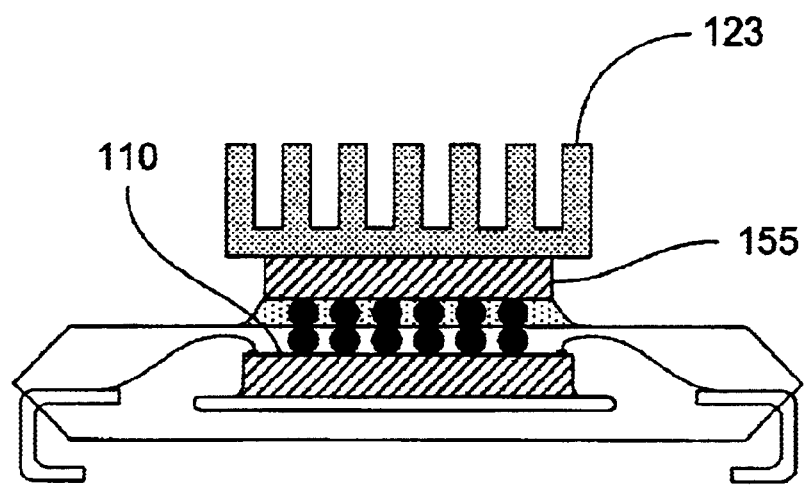
FIG. 8 illustrates an embodiment of the stacked molding package having a heat sink attached to the top surface of a daughter die.

FIG. 8 illustrates an embodiment of the stacked molded package 100 having a heat sink 123 attached to the top surface of a daughter die 155. The heat sink 123 provides a location to which heat generated from the both the mother die 110 and the daughter die 155 may travel so that heat may then dissipate into the surrounding environment. As can be appreciated by those of ordinary skill in the art, the heat sink 123 can be a variety of shapes and sizes depending upon the amount of heat dissipation required.

Figure 9:
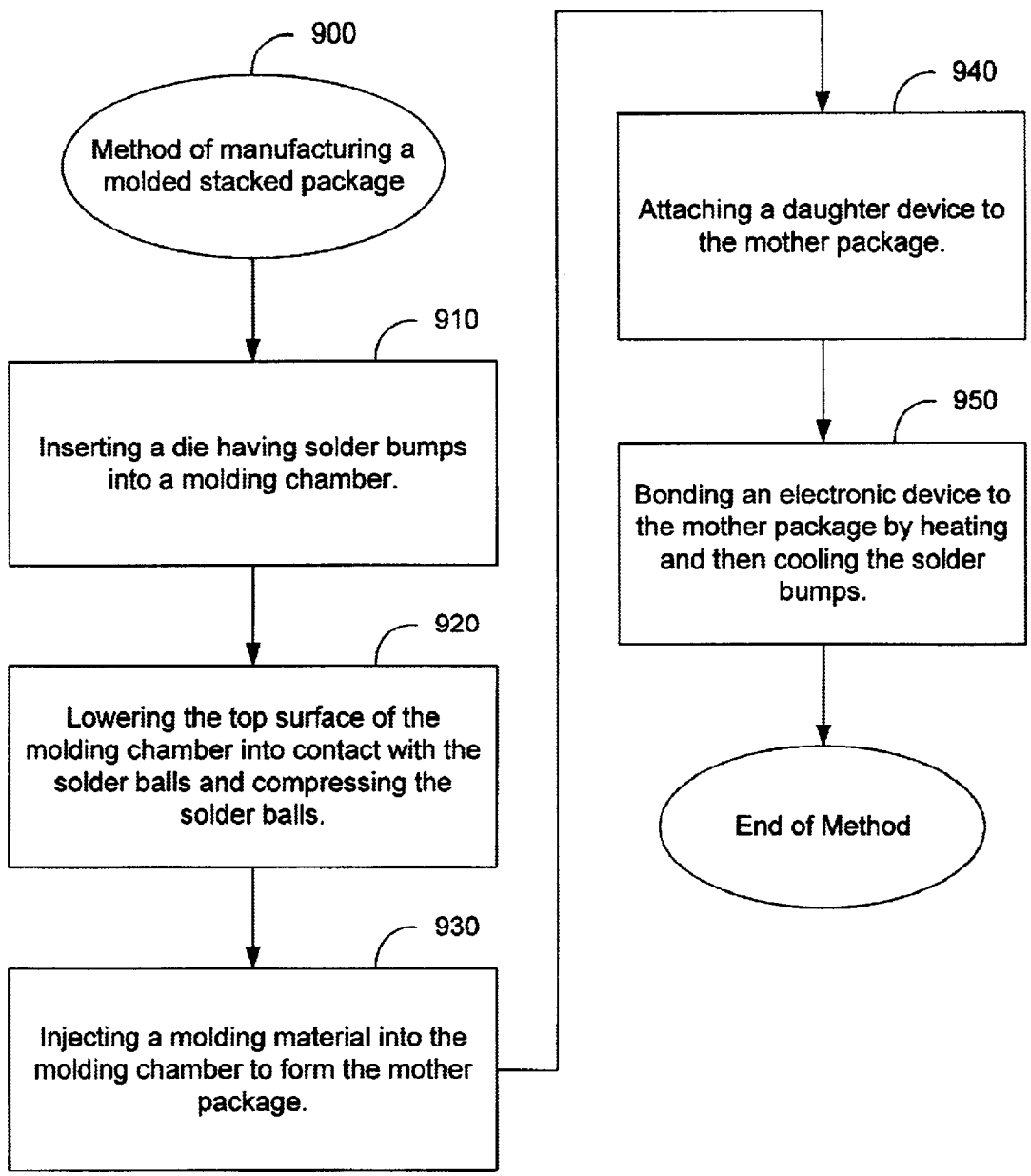
FIG. 9 is a flow diagram representing a specific implementation of the method for manufacturing the stacked molded packaged.

FIG. 9 is a flow diagram representing a specific implementation of the method for manufacturing 900 the stacked molded packaged 100. The method for manufacturing 900 begins in block 910 by inserting a die 110, which has solder bumps 115 on its top surface, into a molding chamber. The top surface of the molding chamber then closes down upon the mother die 110, thereby sealing the mother die within the molding chamber. As the top surface lowers upon the mother die 110 in block 920, the top surface comes into contact with and compresses the solder bumps 115. The portion of the solder balls in contact with the top surface of the molding chamber are therefore flattened and become the pads 117. It should be noted that the molding chamber utilized may be part of the same manufacturing infrastructure used to produce single chip packages (i.e., SOP, DIP, PGA, LCC, QFP, BGA, and CSP). Significant costs are saved through the ability to use existing semiconductor manufacturing infrastructure since the need to acquire infrastructure customized for stacked-chip configurations is avoided. As may be appreciated by those of skill in the art, the other various components required to form a complete semiconductor package will also be placed within the molding chamber. Such components may include a die attach pad, wire leads, interconnecting wires, and heat slugs. These components will not be further discussed since their use in the manufacturing process is well known in the art.

In block 930, a liquid form of the molding material 135 is injected into the molding chamber in order to encapsulate the mother die 110 and the solder bumps 115. Since the pads 117 are in contact with the top surface of the molding chamber, the pads 117 do not become covered by the molding material. By keeping the pads 117 exposed electrical connections between the pads 117 and the solder bumps 150 of a device to be attached may be completed. Generally, the height of the solder bumps 115, before being compressed, should exceed the thickness of the molding material from the top surface of the mother die 110 to the top surface of the mother package's molding material 135 by approximately 5–10% of the height of the pre-compressed solder bumps 115. Such a geometry ensures proper contact between the solder bumps 115 and the top surface of the molding chamber. In one embodiment, the solder bumps 115 are 140–150 microns in height. The size and height of the solder bumps affects the surface area of the pad 117. The surface area of the pad 117, in tun, affects the margin of error available for placing an electronic device on top of the mother package 105 so that the solder bumps of each device make proper contact.

The solder bumps 115 may be made of high lead-content materials (i.e., 10Sn/90Pb) which have melting temperatures in the range of 268–302 degrees Celsius. The high lead-content solder bumps are capable of retaining their shapes and positions on the mother die 110 during the injection phase of the manufacturing process. As may be appreciated, the solder bumps may be made from other suitable materials.

After the liquid molding material 135 solidifies, the mother package 105 is removed from the molding chamber. In block 940 an electronic device is attached to the mother package 105 such that the electrical contacts of the electronic device are aligned with and make contact with the pads 117 of the mother package 105. As may be appreciated, the electronic device may be a variety of electronic devices ranging film a semiconductor die to an opto-electronic transceiver device.

Block 950 represents the operation of bonding the electronic device to the mother package 105 when the electrical contacts of the daughter die are solder bumps. The bonding is performed by heating the solder bumps until they soften Then the solder bumps are cooled so that they may bond to the pads 117 of the mother package 105.

Figure 10:
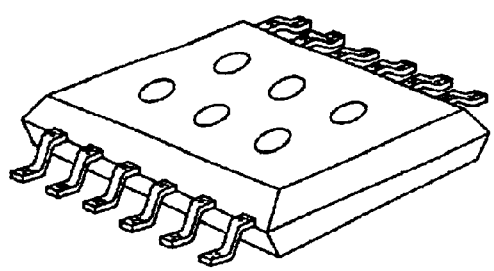
FIG. 10 illustrates a perspective view of a mother package which is a SOP (Small Outline Package).
Figure 11:
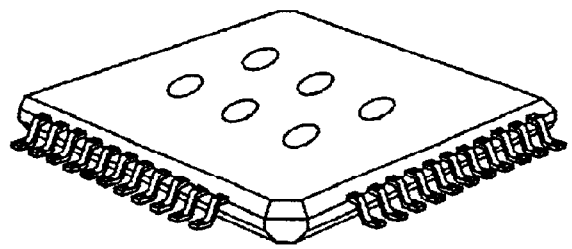
FIG. 11 illustrates a perspective view of a mother package which is QFP (Quad Flatpack).
Figure 12:
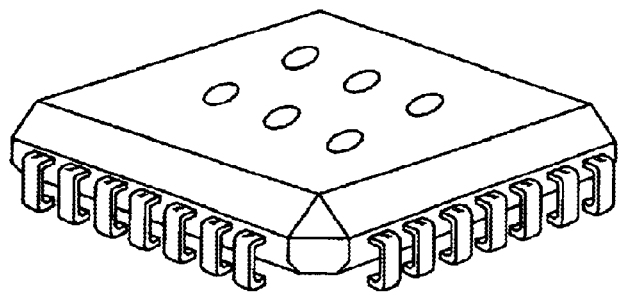
FIG. 12 illustrates a perspective view of a mother package which is LCC (Leaded Chip Carrier).

FIG. 10–FIG. 16B illustrate alternative embodiments of the mother package 105 in which the mother package 105 is formed according to a few of the representative molded package form factors offered by the National Semiconductor Corporation. FIG. 10 illustrates a perspective view of a mother package which is a SOP (Small Outline Package). FIG. 11 illustrates a perspective view of a mother package which is a QFP (Quad Flatpack). FIG. 12 illustrates a perspective view of a mother package which is a LCC (Leaded Chip Carrier). FIG. 13 illustrates a perspective view of a mother package which is a DIP (Dual In-Line Package). FIG. 14A illustrates a perspective view of the bottom surface of a mother package which is PGA (Pin Grid Array). FIG. 14B illustrates a perspective view of the top surface of the mother package of FIG. 14A. FIG. 15A illustrates a perspective view of the bottom surface of a mother package which is a BGA (Ball Grid Array). FIG. 15B illustrates a perspective view of the top surface of the mother package of FIG. 15A. FIG. 16A illustrates a perspective view of the bottom surface of a mother package which is a CSP (Chip Sized Package). FIG. 16B illustrates a perspective view of the top surface of the mother package of FIG. 16A. Detailed information regarding the form factors provided by the National Semiconductor Corporation is provided in the National Semiconductor Corp. Package Databook, 1993 Edition, which is hereby incorporated by reference. As may be appreciated, the present invention may be implemented with molded package form factors which are not illustrated FIG. 10–FIG. 16B.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor device comprising:
   a first semiconductor die having a surface that has a first and a second input/output pad;
   a first electrical contact formed on the first input/output pad, the first electrical contact being a solder ball and having a contact surface;
   an interconnecting wire having a first and a second end, the first end being wirebonded to the second input/output pad; and
   a molding material covering the interconnecting wire, and at least part of the first die and the first electrical contact such that the contact surface of the first electrical contact is exposed through and is flat and flush with a ton surface of the molding material.

2. The semiconductor device as recited in claim 1 further comprising:
   a second device; and
   a second electrical contact formed on a surface of the second device, the second electrical contact being configured to be placed in electrical connection with the contact surface of the first electrical contact.

3. The semiconductor device as recited in claim 2 wherein:
   the second device is a second semiconductor die; and
   the second electrical contact is a solder bump.

4. The semiconductor device as recited in claim 2 wherein the second device is an optical device.

5. The semiconductor device as recited in claim 1 wherein the semiconductor device is formed according a form factor selected from the group consisting of Small Outline Package, Quad Flatpack, Leaded Chip Carrier, Dual In-Line Package, Pin Grid Array, Ball Grid Array, and Chip Sized Package.

6. The semiconductor device as recited in claim 1 wherein the first electrical contact is a compressed solder bump.

7. The semiconductor device as recited in claim 1 further comprising a wire lead, the wire lead being electrically connected to the semiconductor die wherein the second end of the interconnecting wire is attached to the wire lead, the wire lead being partially covered by the molding material.

8. The semiconductor device as recited in claim 1 wherein the first die is attached to a die attach pad and the die attach pad being at least partially covered by the molding material.

9. The semiconductor device as recited in claim 2 further comprising a thermal solder ball formed between the first die and the second device so to facilitate the heat transfer between the first die and the second device.

10. The semiconductor device as recited in claim 2 further comprising an underfill material formed between the first die and the second device.

11. The semiconductor device as recited in claim 1 further comprising a heat slug which is attached to the first die, the molding material covering at least part of the heat slug.

12. The semiconductor device as recited in claim 1 further comprising a heat slug which is completely covered by the molding material.

13. The semiconductor device as recited in claim 2 further comprising a heat sink which is attached to the second device.

14. The semiconductor device as recited in claim 1 further comprising a plurality of the first electrical contacts formed on the surface of the first die, each of the plurality of the first electrical contacts having a contact surface, the molding material substantially covering each of the plurality of the first electrical contacts such that the contact surface of each of the first electrical contacts are not covered.

15. The semiconductor device as recited in claim 14, wherein the plurality of the first electrical contacts are located along a perimeter of the first die.

16. The semiconductor device as recited in claim 14 wherein the plurality of the first electrical contacts are formed in an array on the surface of the first die.

17. The semiconductor device as recited in claim 14 further comprising:
- a second device; and
- a plurality of second electrical contacts formed on a surface of the second device, each of the second electrical contacts being configured to be placed in electrical connection with a contact surface of each of the first electrical contacts.

18. A semiconductor device as recited in claim 1 wherein the flat and flush contact surface of the first electrical contact is made by compressing the first electrical contact with the ton surface of the molding chamber.

19. A semiconductor device package comprising:
- a first semiconductor die having a top surface;
- a plurality of solder balls attached to the top surface of the first semiconductor die;
- a plurality of electrically conductive leads;
- a plurality of interconnecting wires that each have a first end and a second end, the first end of each wire being attached to the top surface of the first semiconductor die and the second end of each wire being attached to a respective lead; and
- a molding material block having a top surface and a bottom surface, the block completely encapsulating the first semiconductor die and each of the wires, the block also partially encapsulating each of the solder balls and the leads such that each of the solder balls are exposed through the top surface of the block, wherein the portions of the solder balls that are exposed through the block are flat and flush with the too surface of the molding material block.

20. A semiconductor device package as recited in claim 19 wherein each of the leads are exposed through the bottom surface of the block.

21. A semiconductor device package as recited in claim 20 wherein the portions of the leads that are exposed through the block are flat and flush with the bottom surface of the block.

22. A semiconductor device package as recited in claim 19 wherein the solder balls are electrically separated from the wires.

23. A semiconductor device package as recited in claim 19 further comprising:
- an external device that is electrically connected to the semiconductor device package through the solder balls that are exposed through the top surface of the block.

24. A semiconductor device package as recited in claim 23 wherein the external device is an optical device.

25. A semiconductor device package as recited in claim 23 further comprising:
- a printed circuit board that is electrically connected to the semiconductor device package through the leads.

26. A semiconductor device package as recited in claim 19 further comprising:
- a plurality of solder pads formed on the top surface of the first semiconductor die, each of the solder balls being formed on top of a respective solder pad such that each solder ball is attached to the first semiconductor die via one of the solder pads; and
- a plurality of wirebond pads formed on the top surface of the first semiconductor die, each of the first ends of each wire being attached to the top surface of the first semiconductor die via respective wirebond pads.

27. A semiconductor device package as recited in claim 21 wherein each of the leads are also exposed through a respective side surface of the molding material block and wherein each of the leads are only exposed through the bottom and a respective side surface of the block.

28. A semiconductor device package as recited in claim 21 wherein each of the leads are only exposed through the bottom surface of the block.

\* \* \* \* \*